United States Patent
Huang et al.

(10) Patent No.: US 8,592,276 B2
(45) Date of Patent: Nov. 26, 2013

(54) FABRICATION METHOD OF VERTICAL SILICON NANOWIRE FIELD EFFECT TRANSISTOR

(75) Inventors: Ru Huang, Beijing (CN); Jiewen Fan, Beijing (CN); Yujie Ai, Beijing (CN); Shuai Sun, Beijing (CN); Runsheng Wang, Beijing (CN); Jibin Zou, Beijing (CN); Xin Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/501,711

(22) PCT Filed: Nov. 18, 2011

(86) PCT No.: PCT/CN2011/082457
§ 371 (c)(1),
(2), (4) Date: Apr. 12, 2012

(87) PCT Pub. No.: WO2013/007073
PCT Pub. Date: Jan. 17, 2013

(65) Prior Publication Data
US 2013/0011980 A1    Jan. 10, 2013

(30) Foreign Application Priority Data

Jul. 8, 2011  (CN) .......................... 2011 1 0190786

(51) Int. Cl.
*H01L 21/336* (2006.01)
(52) U.S. Cl.
USPC .............. 438/268; 257/E21.375; 257/E21.41; 977/938

(58) Field of Classification Search
USPC .................... 977/762, 936, 937, 938; 438/268
See application file for complete search history.

(56) References Cited

FOREIGN PATENT DOCUMENTS

| CN | 1957477 A | 5/2007 |
| CN | 101273459 A | 9/2008 |
| KR | 2009-0026986 A | 3/2009 |

OTHER PUBLICATIONS

International Search Report and Written Opinion issued Apr. 19, 2012 for PCT/CN2011/082457 (13 pages).
Yang, et al. "CMOS Compatible Gate-All-Around Vertical Silicon-Nanowire MOSFETs," Institute of Microelectronics, A*STAR, Singapore, IEEE 978-1-4244-2364-4/08 (2008), p. 318-321.

*Primary Examiner* — Michelle Mandala
*Assistant Examiner* — Shaka White
(74) *Attorney, Agent, or Firm* — Christie, Parker & Hale, LLP

(57) ABSTRACT

The present invention discloses a fabrication method of a vertical silicon nanowire field effect transistor having a low parasitic resistance, which relates to a field of an ultra-large-integrated-circuit fabrication technology. As compared with a conventional planar field effect transistor, on one hand the vertical silicon nanowire field effect transistor fabricated by the present invention can provide a good ability for suppressing a short channel effect due to the excellent gate control ability caused by the one-dimensional structure, and reduce a leakage current and a drain-induced barrier lowering (DIBL). On the other hand, an area of the transistor is further reduced and an integration degree of an IC system is increased.

9 Claims, 21 Drawing Sheets

Silicon Oxide     Undoped Silicon

Highly-doped Silicon     Polysilicon     Metal

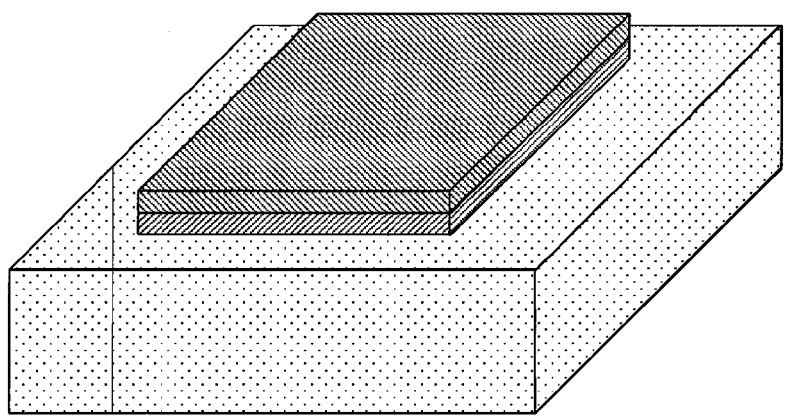
Figure 1A
  
Silicon Oxide  Silicon Nitride  Undoped Silicon

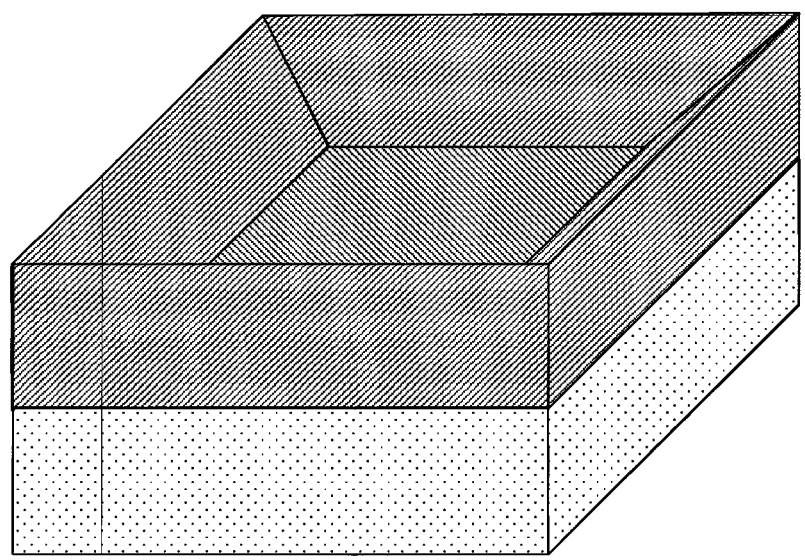
Figure 1B
      
Silicon Oxide      Silicon Nitride     Undoped Silicon

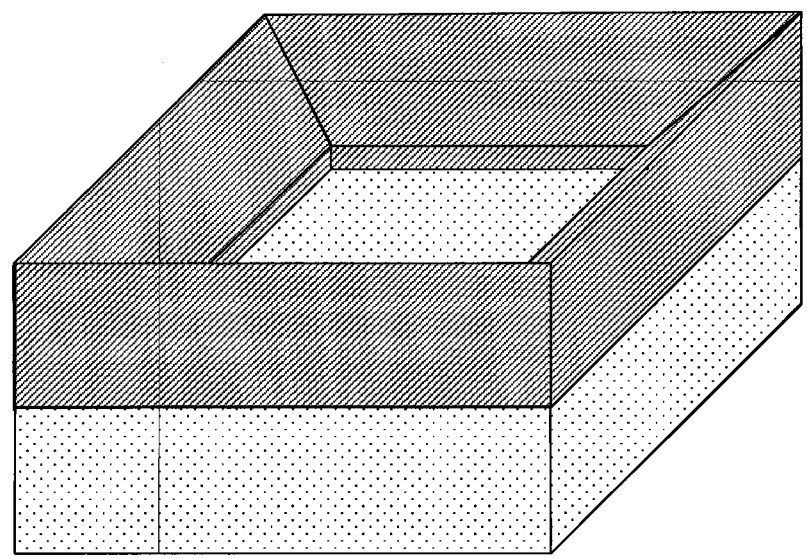
Figure 1C
   
Silicon Oxide                                          Undoped Silicon

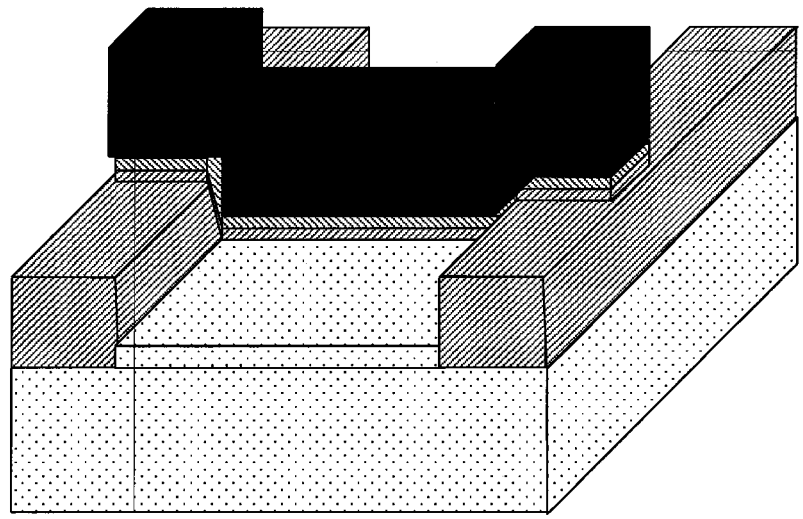
Figure 2A
      
Silicon Oxide     Silicon Nitride     Undoped Silicon
Photoresist

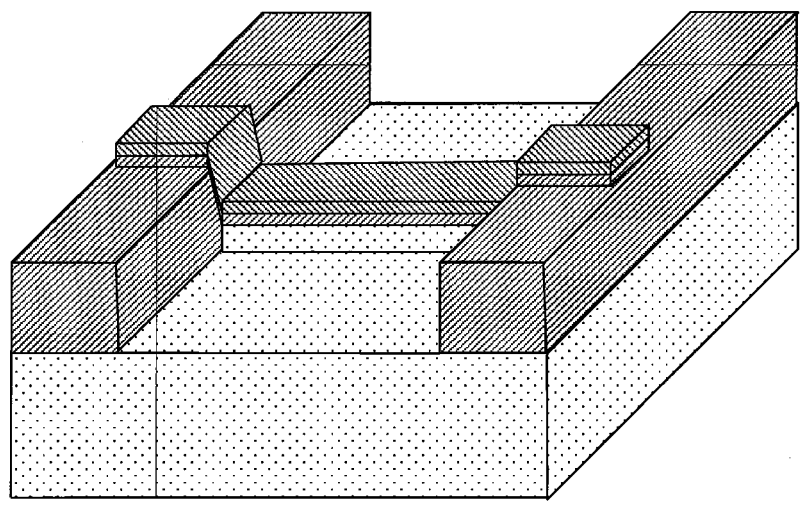
Figure 2B
    
Silicon Oxide    Silicon Nitride    Undoped Silicon

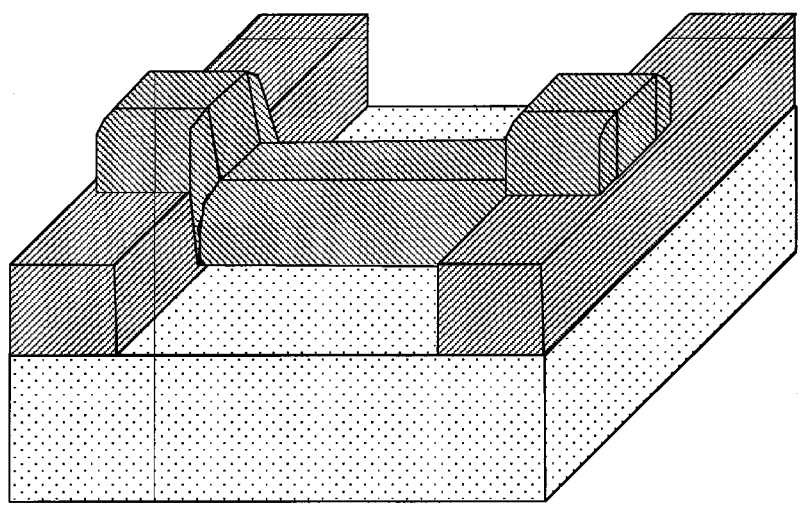
Figure 2C
  
Silicon Oxide        Silicon Nitride        Undoped Silicon

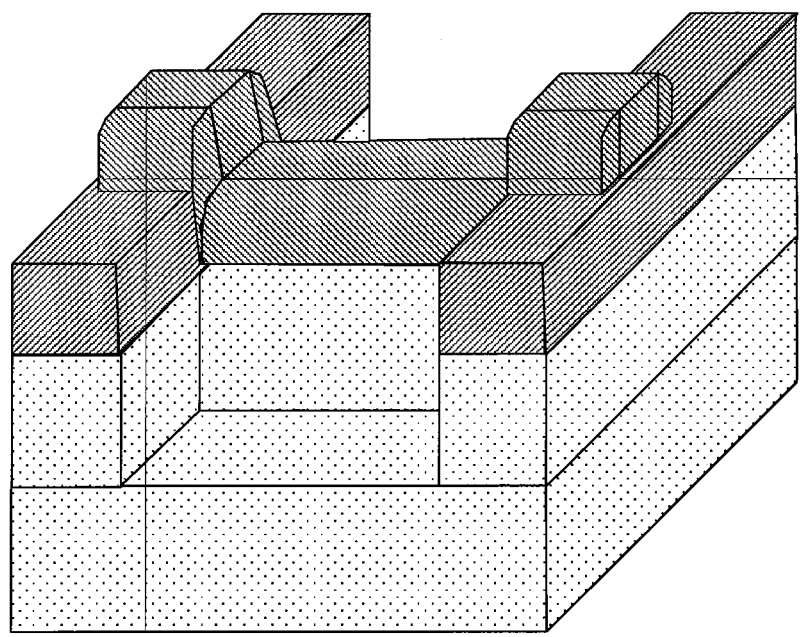
Figure 2D
  
Silicon Oxide        Silicon Nitride        Undoped Silicon

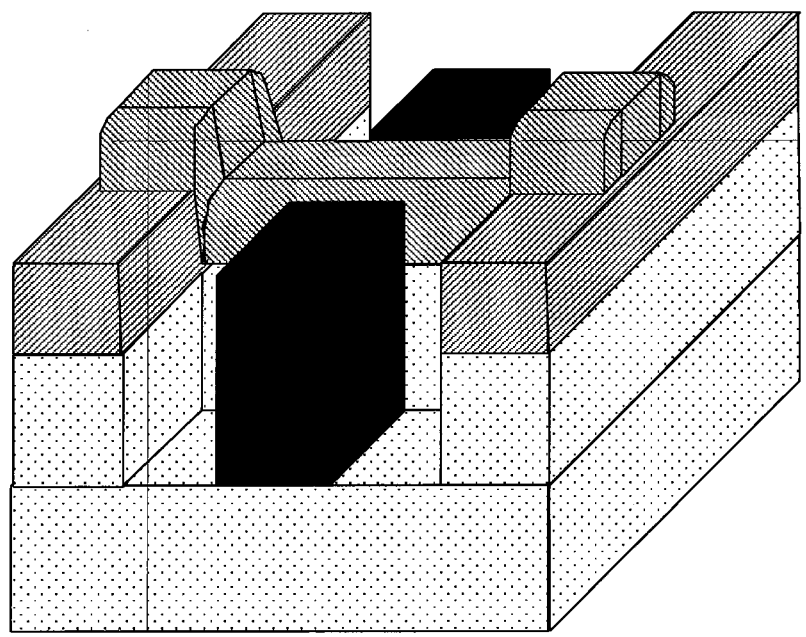
Figure 2E
  
Silicon Oxide    Silicon Nitride    Undoped Silicon
Photoresist

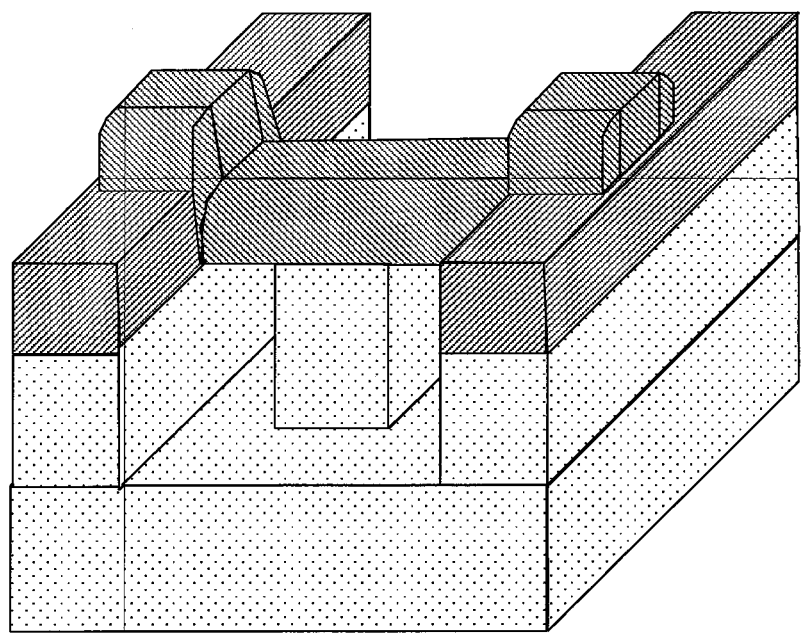
Figure 2F
  
Silicon Oxide　　　　Silicon Nitride　　　　Undoped Silicon

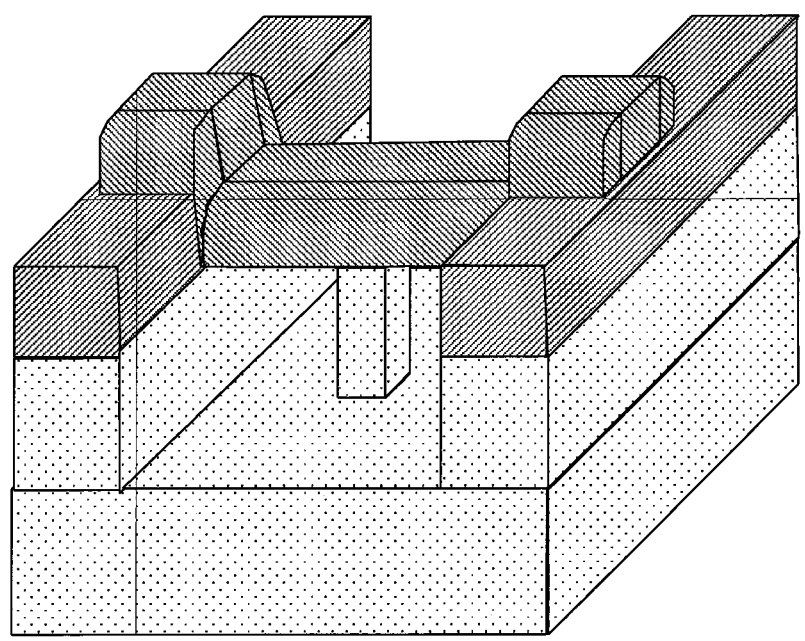
Figure 3A
 Silicon Oxide
 Silicon Nitride
 Undoped Silicon

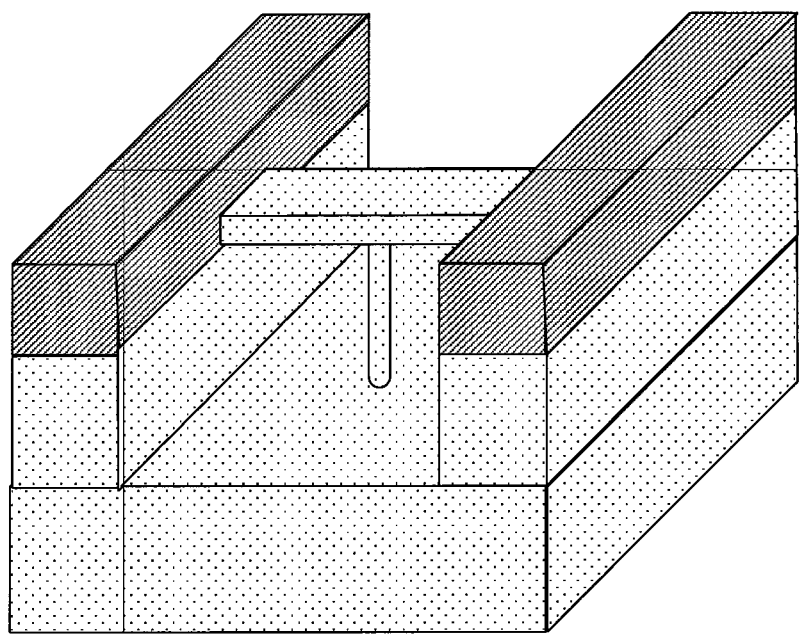
Figure 3B
    
Silicon Oxide    Undoped Silicon

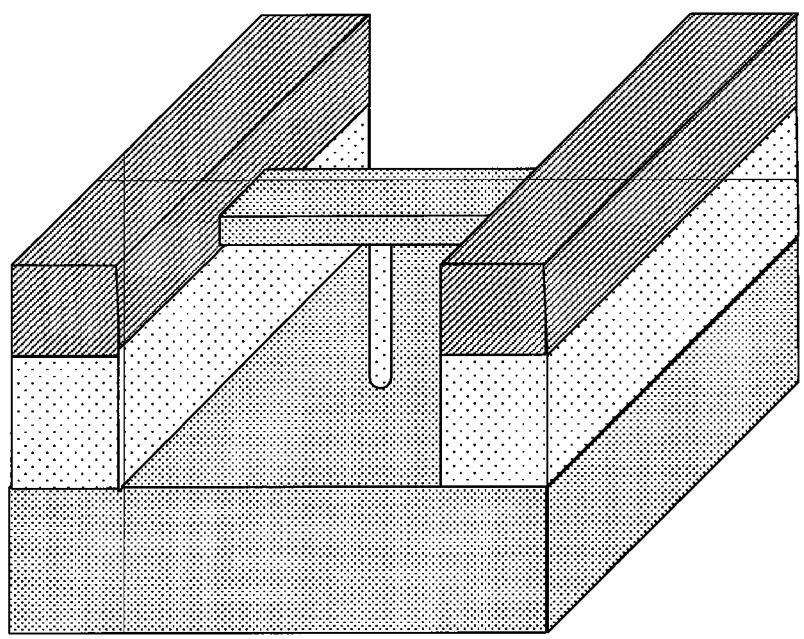
Figure 4A
  
Silicon Oxide     Highly-doped Silicon     Undoped Silicon

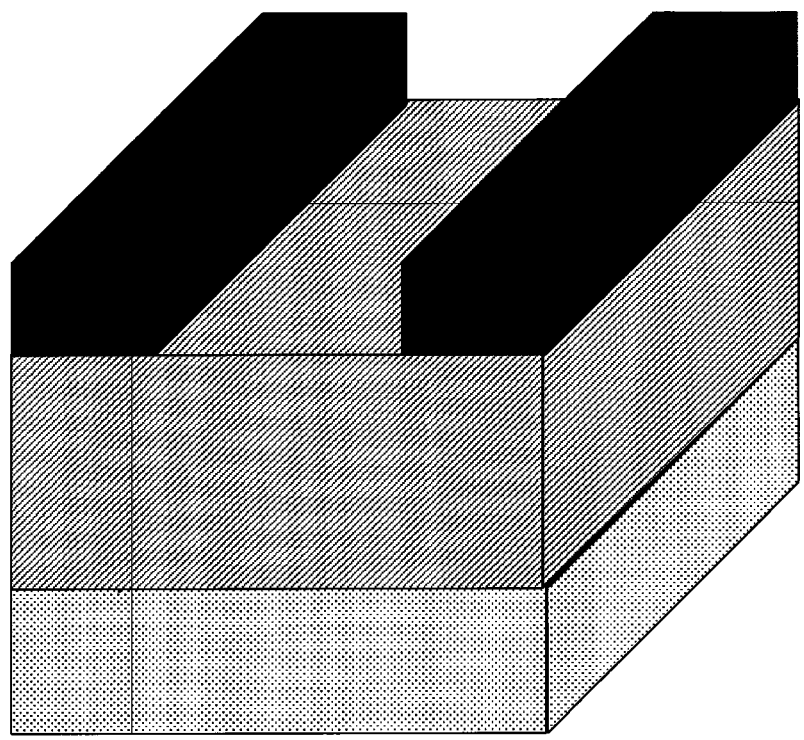
Figure 4B
  
Silicon Oxide  Highly-doped Silicon  Photoresist

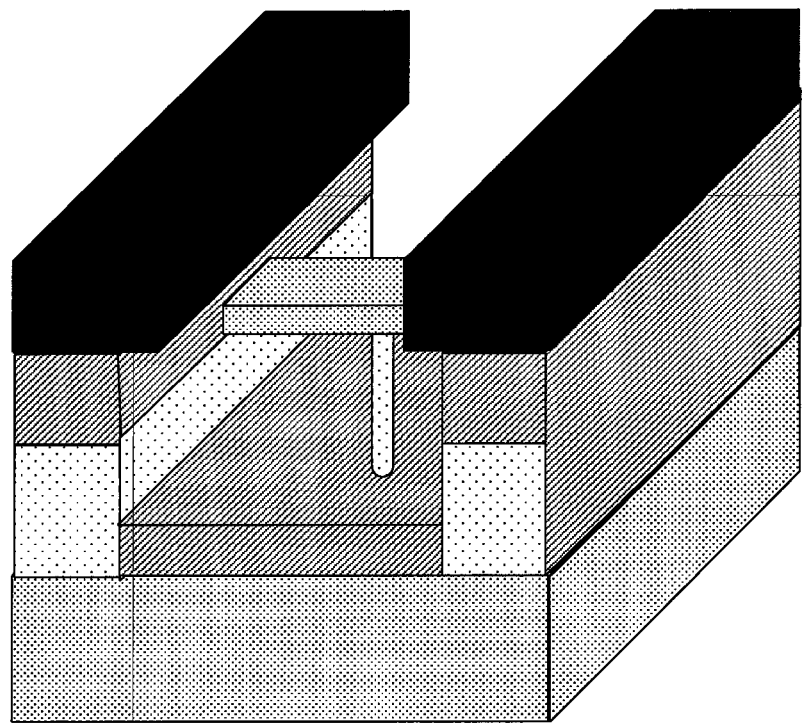
Figure 4C
 Silicon Oxide
 Undoped Silicon
 Photoresist
 Highly-doped Silicon

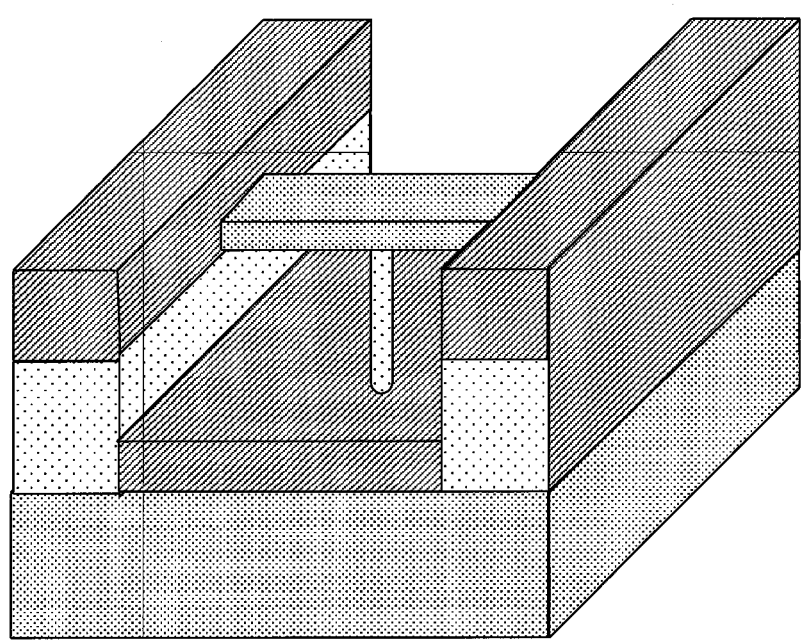
Figure 4D
  
Silicon Oxide       Highly-doped Silicon       Undoped Silicon

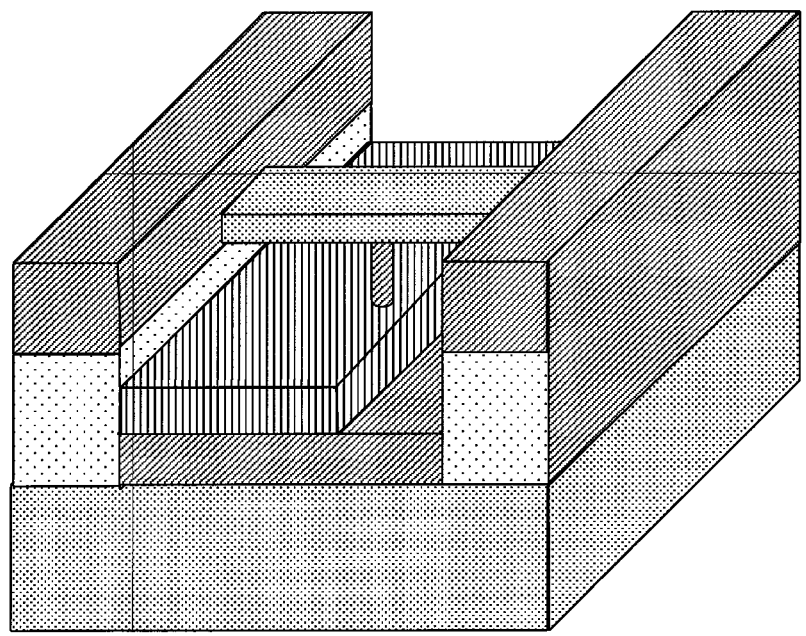
Figure 4E
  
Silicon Oxide    Polysilicon    Undoped Silicon
Highly-doped Silicon

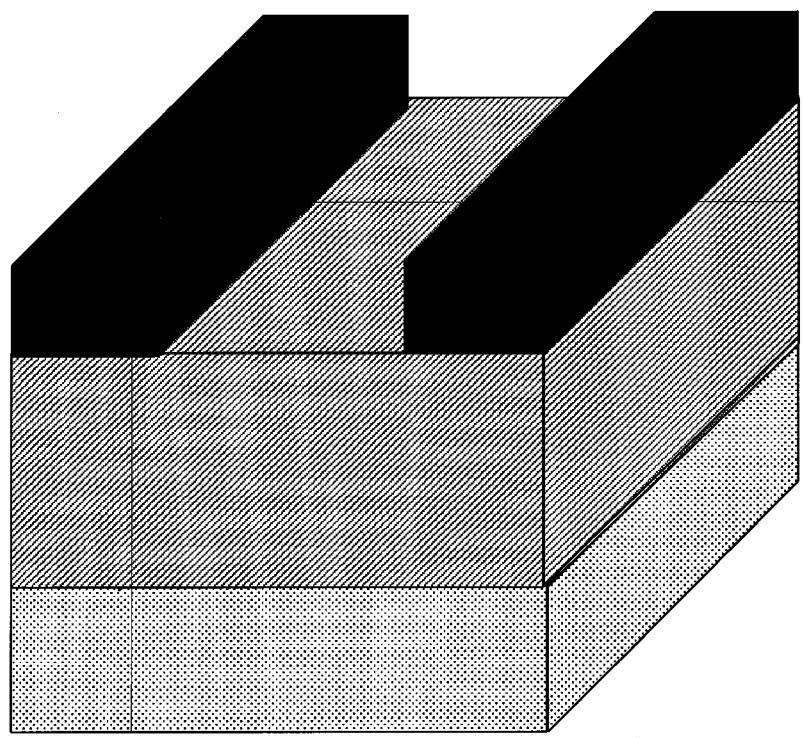
Figure 4F
 Silicon Oxide   Photoresist   Highly-doped Silicon

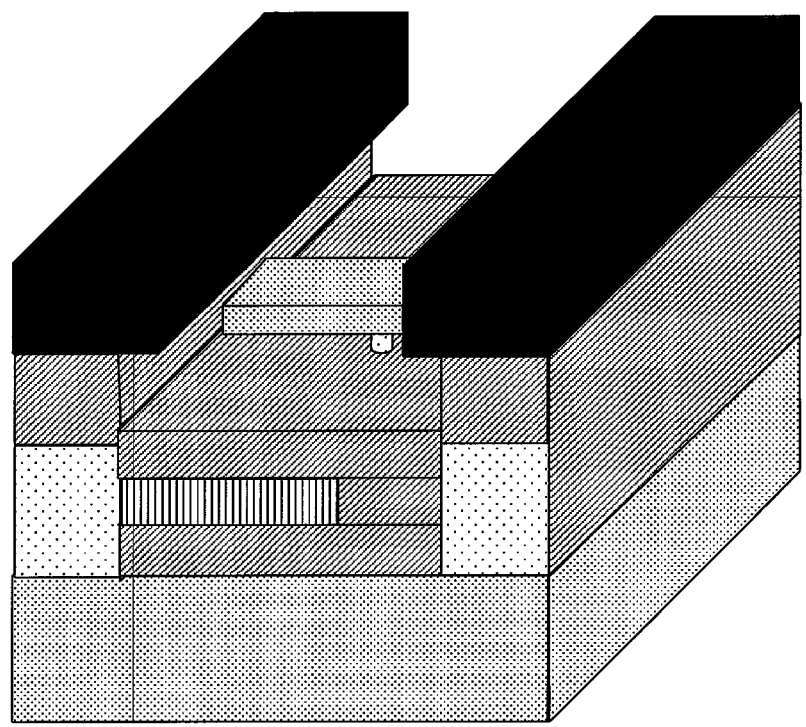
Figure 4G
    
Silicon Oxide    Undoped Silicon
        
Highly-doped Silicon    Polysilicon    Photoresist

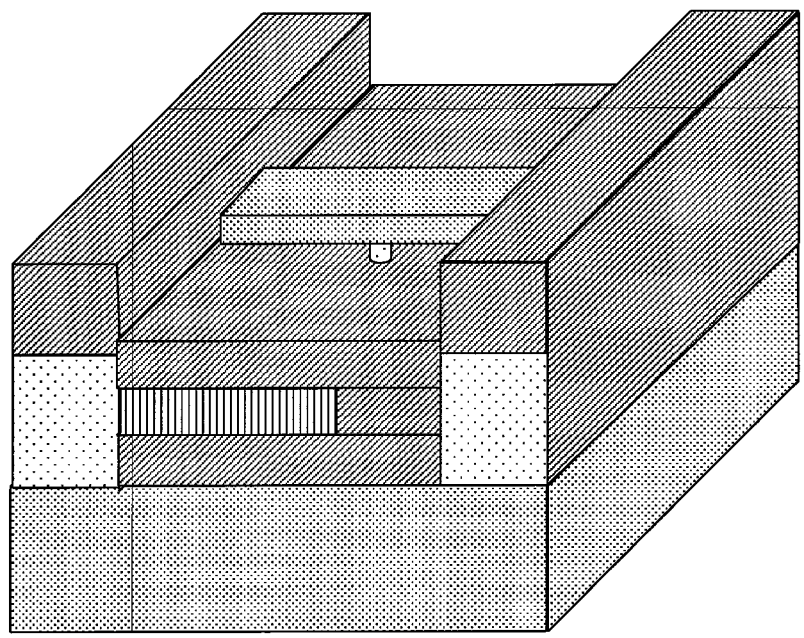
Figure 4H
  
Silicon Oxide  Highly-doped Silicon  Undoped Silicon
Polysilicon

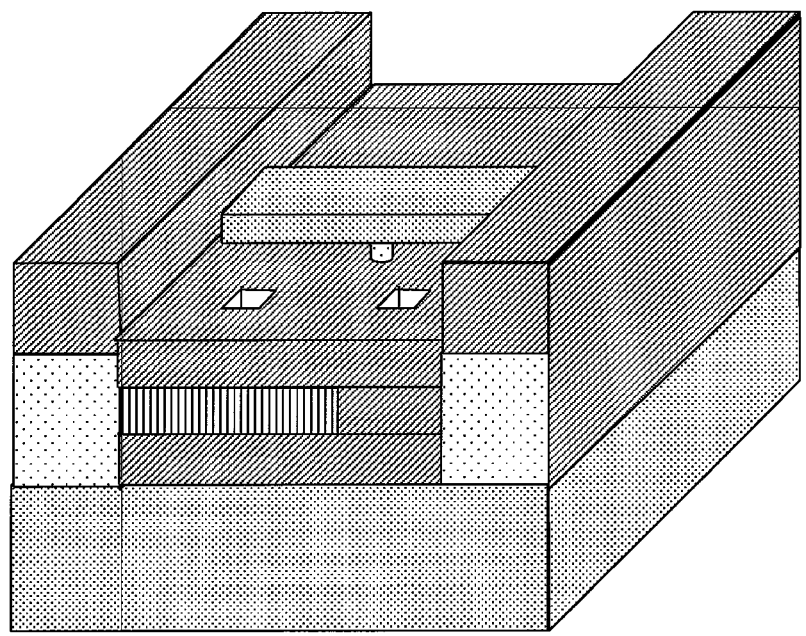
Figure 5A
  
Silicon Oxide    Highly-doped Silicon    Undoped Silicon
Polysilicon

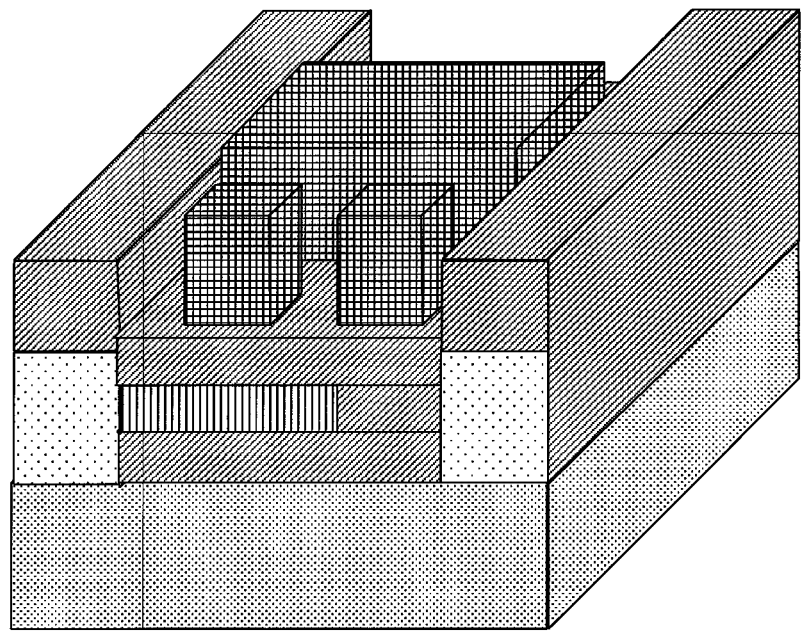
Figure 5B
Silicon Oxide
Undoped Silicon
Highly-doped Silicon
Polysilicon
Metal

FABRICATION METHOD OF VERTICAL SILICON NANOWIRE FIELD EFFECT TRANSISTOR

CROSS-REFERENCE TO RELATED APPLICATION(S)

This application is a National Phase Patent Application and claims priority to and benefit of International Application Number PCT/CN2011/082457, filed on Nov. 18, 2011, which claims priority to and benefit of Chinese Patent Application Number 201110190786.4, filed on Jul. 8, 2011, the entire disclosure of which are incorporated herein by reference.

FIELD OF THE INVENTION

The present invention relates to a fabrication method of a vertical silicon nanowire field effect transistor having a low parasitic resistance, which relates to a field of an ultra-large-scale integration (ULSI) circuit fabrication technology.

BACKGROUND OF THE INVENTION

A semiconductor fabrication technology, as the most rapidly developing technology in the 20th century, is gradually applied into the whole industry production. The semiconductor technology plays a huge role in a modern life. At the same time of pursuing excellent performance of a semiconductor electronic product such as a mobile phone and a computer, it is also desired that the product has a smaller volume, occupies a smaller space, and is more portable and more easily-operated. Therefore, under the Moore's Law, the whole semiconductor industry is being aimed towards a high integration degree, a low power consumption and a high performance. As a feature size is gradually reduced, how to deal with an increasingly serious short channel effect and a series of accompanied deteriorations of device performance will become a key focus of the whole semiconductor industry in the future.

From a conventional planar field effect transistor to an ultra-thin bulk field effect transistor and then to a transistor of a multi-gate and surrounding-gate structure, in order to seek for a better gate control ability and to suppress the short channel effect and a drain-induced barrier lowering effect, there are emerging a lager number of semiconductor devices with new structures. Among them, a one-dimensional nanowire surrounding-gate structure field effect transistor gradually draws more and more attention due to an excellent gate control ability and an advantage in terms of mobility. If the one-dimensional nanowire surrounding-gate structure field effect transistor may be vertically arranged into an array by using a conventional semiconductor fabrication technology, the integration degree of a chip may be further increased, and a production cost may be greatly reduced. However, the conventional vertical silicon nanowire field effect transistor has a limitation. On one hand, since a size of a drain closes to a size of a channel, a large parasitic resistance may be caused and the speed and performance of the transistor may be adversely affected. Therefore, reducing the adverse influence of parasitic resistance by improving a process is a concern of the vertical silicon nanowire transistor. On the other hand, a difficulty in achieving the vertical silicon nanowire field effect transistor lies in a self-alignment of the source/drain and a gate. Due to a vertical structure, in the fabrication of the vertical silicon nanowire field effect transistor, the self-alignment can not be achieved by firstly defining a gate structure and then performing implantation for the source/drain as for a planar field effect transistor.

SUMMARY OF THE INVENTION

An object of an embodiment of the present invention is to provide a fabrication method of a vertical silicon nanowire field effect transistor having a low parasitic resistance, and the object is achieved by the following technical solutions.

Solution 1: A fabrication method of a vertical silicon nanowire field effect transistor having a low parasitic resistance, includes the following steps.

a) Defining an active region and forming a LOCOS isolation

A main object of the step a) is to define a pattern of the active region by using a silicon oxide, silicon nitride film as a hard mask, so as to achieve an isolation between devices and prevent an interference therebetween. This step particularly includes the following steps:

i. depositing a silicon oxide, a silicon nitride over a silicon substrate as a hard mask, by using a low pressure chemical vapor deposition process;

ii. defining the pattern of the active region by performing a photolithography process;

iii. etching the silicon nitride by an anisotropic dry etching method and removing the silicon oxide by an etching process through an BHF solution, so as to transfer the pattern onto the hard mask;

iv. removing a photoresist;

v. forming a silicon oxide by an oxyhydrogen oxidation to form the LOCOS isolation;

vi. removing the silicon nitride by performing an etching process using a hot concentrated phosphoric acid solution;

vii. removing the silicon oxide by performing an etching using a BHF solution.

b) Fabricating the vertical silicon nanowire having a large drain so as to reduce a parasitic resistance of the drain A main object of the step b) is to form a vertical silicon pillar having a large diameter and a top support structure by performing a photolithography process and a dry etching process twice and includes the following steps:

i. depositing a first silicon oxide layer and a first silicon nitride layer as a hard mask, by performing a low pressure chemical vapor deposition process;

ii. defining a lateral bar as a support structure for a drain to be formed subsequently, by performing a photolithography process;

iii. etching the first silicon nitride layer, the first silicon oxide layer and the silicon substrate by using an anisotropic dry etching process;

iv. depositing a second silicon nitride layer as a sidewall structure by using a low pressure chemical vapor deposition process;

v. etching the second silicon nitride by using an anisotropic dry etching process;

vi. etching the silicon to form a silicon bar by using an anisotropic dry etching process;

vii. performing a photolithography process to protect a middle region of the silicon bar, which is to be formed as a device region of the vertical silicon nanowire to be formed subsequently;

viii. etching the silicon by using an isotropic dry etching process to suspend the silicon bar which are not protected by a photoresist;

ix. removing the photoresist.

Herein, in the step b), a width of the silicon bar and a length of a photoresist-protecting silicon bar are designed to have a ratio of 1:2.

c) Further reducing a size of the nanowire to form a vertical silicon nanowire having a diameter of about 10 nm, while remaining a large area of pattern used for the drain on top of the vertical silicon nanowire, so as to reduce the parasitic resistance of the drain A main object of the step c) is to further reduce the size of the vertical silicon pillar to form the vertical silicon nanowire by using an isotropic wet etching process and a sacrifice oxidation process. Also, a cross-section of the vertical silicon pillar is changed to approximately be a circle, so that a better characteristic can be obtained. The step c) further includes the following steps:

i. performing an isotropic wet etching process on the silicon pillar to further reduce the size of the vertical silicon pillar;

ii. performing a dry oxygen oxidation to form a vertical silicon nanowire having a diameter of about 10 nm, and forming a second silicon oxide layer;

iii. removing a silicon oxynitride formed by oxidation of the second silicon nitride layer during the dry oxygen oxidation by performing a wet etching process;

iv. removing the first silicon nitride layer and the second silicon nitride layer formed by the low pressure chemical vapor deposition process by performing a wet etching;

v. removing the second silicon oxide layer formed by the dry oxygen oxidation and the first silicon oxide layer formed by the low pressure chemical vapor deposition, by performing a wet etching process.

d) Defining and doping a source/drain region and a channel region of the vertical silicon nanowire A main object of the step d) is to form a flat silicon oxide isolation layer and a polysilicon gate layer by using a chemical mechanical polishing process, so that to define the source/drain region and channel region of the vertical silicon nanowire field effect transistor, wherein a thickness of a film, which is the remained polysilicon gate after being subject to an isotropic dry etching process, is a desired channel length. Also, a doping process is performed. The step d) further includes the following steps:

i. performing an ion implantation for the source/drain, with an implantation angle perpendicular to a surface of the silicon substrate, and performing an annealing process;

ii. depositing a third silicon oxide layer by using a low pressure chemical vapor deposition process, and performing a planarization of the silicon oxide by using a chemical mechanical polishing (CMP) process;

iii. performing a photolithography process to protect a field oxygen region;

iv. etching the third silicon oxide layer to a certain thickness by performing a wet etching, as an isolation layer of the gate material and the source;

v. removing a photoresist;

vi. forming a gate oxide layer by a dry oxygen oxidation;

vii. depositing a polysilicon by a low pressure chemical vapor deposition, and performing a planarization of the polysilicon by using a chemical mechanical polishing (CMP) process;

viii. performing an ion implantation process on the polysilicon and performing an annealing process;

ix. performing a photolithography to define a gate region, then etching the polysilicon by using an anisotropic dry etching process, and removing a photoresist;

x. etching the polysilicon to a certain thickness by using an isotropic wet etching to form the gate and a gate lead-out;

xi. depositing a fourth silicon oxide layer by using a low pressure chemical vapor deposition, and performing a planarization of the silicon oxide by using a chemical mechanical polishing (CMP) process;

xii. performing a photolithography process to protect the field oxygen region;

xiii. etching the fourth silicon oxide layer by using a wet etching process until the silicon is exposed to form an isolation layer of the gate material and the drain;

xiv. removing a photoresist.

e) Forming a contact hole and a metal interconnection

A main object of the step e) is to lead out the source/drain and the gate, so as to facilitate a test and a setup of a large-scale integrated circuit. The step e) further includes the following steps:

i. performing a photolithography process to form the contact hole for the source and the gate;

ii. etching the silicon oxide by using an anisotropic dry etching process;

iii. etching the silicon oxide by using a BHF solution;

iv. removing a photoresisit;

v. sputtering a metal;

vi. performing a photolithography process to form a lead out for a metal interconnection;

vii. etching the metal by using an anisotropic dry etching process;

viii. removing a photoresist;

ix. performing an alloying process.

The embodiment of the present invention may also implement the ion implantation for the source/drain by the following: after forming the LOCOS isolation of the silicon substrate, firstly performing an ion implantation process to the substrate to implement the doping the source/drain and the channel, so that an accumulative vertical silicon nanowire field effect transistor (Junctionless MOSFET) can be obtained.

Solution 2. A fabrication method of an accumulative vertical silicon nanowire field effect transistor includes the following steps.

a) Defining an active region over a silicon substrate and forming a LOCOS isolation b) Fabricating a vertical silicon nanowire by performing a photolithography process and a dry etching process twice to form a vertical silicon pillar having a large diameter and a top support structure The step b) particularly includes the following steps:

i. performing an ion implantation process on the substrate to implement doping of a source/drain and a channel;

ii. depositing a first silicon oxide layer and a first silicon nitride layer as a hard mask, by using a low pressure chemical vapor deposition process;

iii. performing a photolithography process to define a lateral bar as a support structure for a drain to be formed later;

iv. etching the first silicon nitride layer, the first silicon oxide layer, and the silicon substrate by using an anisotropic dry etching process;

v. depositing a second silicon nitride layer as a sidewall structure by using a low pressure chemical vapor deposition process;

vi. etching the second silicon nitride layer by using an anisotropic dry etching process;

vii. etching the silicon substrate by using an anisotropic dry etching process to form a silicon bar;

viii. performing a photolithography process to protect a middle region of the silicon bar, which is to be formed as a device region of the vertical silicon nanowire to be formed later;

ix. etching the silicon substrate by using an isotropic dry etching process to suspend the silicon bar unprotected by a photoresist;

x. removing the photoresist. Herein, in the step b), a width of the silicon bar and a length of a photoresist-protecting silicon bar are designed to have a ratio of 1:2.

c) Further reducing the size of the nanowire to form a vertical silicon nanowire having a diameter of about 10 nm, while remaining a large area of pattern used for the drain on top of the vertical silicon nanowire, so as to reduce the parasitic resistance of the drain The step c) particularly includes the following steps:

i. etching the silicon by using an isotropic wet etching process to further reduce the size of the silicon pillar;

ii. performing a dry oxygen oxidation to form the vertical silicon nanowire having a diameter of about 10 nm, and forming a second silicon oxide layer;

iii. removing a silicon oxynitride formed by oxidation of the second silicon nitride layer during the dry oxygen oxidation by performing a wet etching process;

iv. removing the first silicon nitride layer and the second silicon nitride layer formed through the low pressure chemical vapor deposition process by performing a wet etching process;

v. removing the second silicon oxide layer formed through the dry oxygen oxidation and the first silicon oxide layer formed through the low pressure chemical vapor deposition, by performing a wet etching process.

d) Defining and doping a source/drain region and a channel region of the vertical silicon nanowire The step d) particularly includes the following steps:

i. depositing a third silicon oxide layer by using a low pressure chemical vapor deposition process, and performing a planarization of the silicon oxide by using a chemical mechanical polishing (CMP) process;

ii. performing a photolithography process to protect a field oxygen region;

iii. etching the third silicon oxide layer to a certain thickness by performing a wet etching process, as an isolation layer of the gate material and the source;

iv. removing a photoresist;

v. forming a gate oxide layer by a dry oxygen oxidation;

vi. depositing a polysilicon by a low pressure chemical vapor deposition, and performing a planarization of the polysilicon by using a chemical mechanical polishing (CMP) process;

vii. performing an ion implantation on the polysilicon and performing an annealing process;

viii. performing a photolithography process to define a gate region, and then etching the polysilicon using an anisotropic dry etching process, and removing a photoresist;

ix. etching the polysilicon to a certain thickness by using an isotropic wet etching to form the gate and a gate lead-out;

x. depositing a fourth silicon oxide layer by using a low pressure chemical vapor deposition, and performing a planarization of the silicon oxide by using a chemical mechanical polishing (CMP) process;

xi. performing a photolithography to protect the field oxygen region;

xii. etching the fourth silicon oxide layer by using a wet etching process until the silicon is exposed to form an isolation layer of the gate material and the drain;

xiii. removing a photoresist.

e) Forming a contact hole and a metal interconnection

The embodiment of the present invention has the following technical effects.

Firstly, as compared with the conventional planar field effect transistor, on one hand the vertical silicon nanowire field effect transistor fabricated by an embodiment of the present invention can provide a good ability of suppressing a short channel effect due to the excellent gate control ability caused by its one-dimensional structure, and can reduce a leakage current and a drain-induced barrier lowering (DIBL). On the other hand, due to the novel vertical structure, an area of the transistor is further reduced and an integration degree of an IC system is increased. Therefore, the transistor of the present invention can be more suitable for a future circuit desired for low power consumption. It is particularly noted that, it is difficult to form a large source/drain structure in the conventional vertical silicon nanowire field effect transistor, so that parasitic resistance of the source/drain is large, thereby a speed of the transistor may be significantly affected. However, based on the vertical silicon nanowire field effect transistor formed by an embodiment of the present invention, an area of the source/drain is increased, thus the parasitic resistance of the source/drain can be effectively reduced, and performance of the transistor is improved. Finally, another difficulty in terms of the process of the vertical silicon nanowire field effect transistor is that the source/drain and the channel have different doped impurities, and it is difficult to achieve a self-alignment of the source/drain and the gate structure. An embodiment of the present invention provides an accumulative transistor, so that the source/drain and the channel have identical doping impurities, thereby the above problem can be well obviated.

BRIEF DESCRIPTION OF THE DRAWINGS

FIGS. 1-5 are schematic diagrams showing a process flow of fabricating a an accumulative vertical silicon nanowire field effect transistor proposed by an embodiment of the present invention. The process flow is briefly described as followings.

In FIG. 1, an active region is defined, and a LOCOS isolation is formed, wherein, in FIG. 1A a silicon oxide and a silicon nitride are deposited over a silicon substrate as a hard mask by using a low pressure chemical vapor deposition process; in FIG. 1B, a LOCOS isolation is implemented by an oxyhydrogen oxidation process; FIG. 10 is a diagram showing a structure after the hard mask is removed by a wet etching process.

In FIG. 2, the vertical silicon nanowire is fabricated to have a large drain so as to reduce the parasitic resistance of the source/drain, wherein, in FIG. 2A, a hard mask bar formed of a silicon oxide and a silicon nitride is formed as a support structure for the drain to be formed later; FIG. 2B is a diagram showing a structure after the silicon is etched by using an anisotropic dry etching process; in FIG. 2C, a silicon nitride sidewall is formed; FIG. 2D is a diagram showing a structure after the silicon is etched by using a anisotropic dry etching process; in FIG. 2E, a photolithography process is performed to protect an middle region of the silicon bar, which is used as a device region of the vertical silicon nanowire to be formed later; in FIG. 2F, the silicon is etched by using an isotropic dry etching process to suspend the silicon bar unprotected by a photoresist.

In FIG. 3, a size of the nanowire is further reduced to form the vertical silicon nanowire having a diameter of about 10 nm, and a large area of pattern used for the drain on top of the vertical silicon nanowire is remained to reduce the parasitic resistance of the drain, wherein, in FIG. 3A, the silicon is etched by an HNA solution to further reduce the size of the nanowire; FIG. 3B is a diagram showing a structure after the size of a silicon pillar is further reduced by performing an sacrifice oxidation and the silicon oxide, the silicon nitride are removed by a wet etching process.

In FIG. 4, a source/drain region and a channel region of the vertical silicon nanowire are defined and doped, wherein, in FIG. 4A, an ion implantation is performed on the source/drain with an implantation angle perpendicular to a surface of the silicon substrate, and an annealing process is performed; in FIG. 4B, a silicon oxide is deposited by using a low pressure chemical vapor deposition process, and a photolithography process is performed to protect a field oxygen region after implementing a planarization of the silicon oxide with a chemical mechanical polishing (CMP) process; in FIG. 4C, the silicon oxide is etched to a certain thickness by using a BHF solution, to be used as an isolation layer of the gate material and the source; in FIG. 4D, a photoresist is removed; in FIG. 4E, a gate dielectric and a gate lead-out are formed; in FIG. 4F, a silicon oxide is deposited again by using a low pressure chemical vapor deposition process, and a photolithography process is performed to protect a field oxygen region after performing a planarization of the silicon oxide by using a chemical mechanical polishing (CMP) process; in FIG. 4G, the silicon oxide is etched to a certain thickness by using a BHF solution, as an isolation layer of the gate material and the drain; in FIG. 4H, a photoresist is removed.

In FIG. 5, a contact hole and a metal interconnection are formed, wherein, in FIG. 5A, the contact hole for the gate and the source are formed. In FIG. 5B, a lead out for the metal interconnection is formed.

DETAILED DESCRIPTION OF THE EMBODIMENTS

Hereinafter, an embodiment of the present invention will be described in more detail with reference to drawings and a specific embodiment. Herein, it is provided a solution for a process of a vertical silicon nanowire field effect transistor having a low parasitic resistance according to an embodiment of the present invention. However, the description does not limit the scope of the present invention by any way.

The vertical silicon nanowire field effect transistor having a channel length of about 90 nm and a diameter of about 10 nm is fabricated by the following steps.

1. A silicon oxide of 300 Å is deposited by using a low pressure chemical vapor deposition process.
2. A silicon nitride of 1000 Å is deposited by using a low pressure chemical vapor deposition process.
3. A photolithography process is performed to define an active region.
4. The silicon nitride of 1000 Å is etched by using an anisotropic dry etching process.
5. The silicon oxide of 300 Å is etched by using a BHF solution for over-etching for 5 s, as shown in FIG. 1A.
6. A photoresist is removed.
7. A silicon oxide of 5000 Å is grown by using an oxyhydrogen oxidation process, so as to form a LOCOS isolation, as shown in FIG. 1B.
8. The silicon nitride of 1000 Å is etched by using a hot concentrated phosphoric acid.
9. The silicon oxide of 300 Å is etched by using a BHF solution, as shown in FIG. 1C.
10. A silicon oxide of 300 Å is deposited by using a low pressure chemical vapor deposition process.
11. A silicon nitride of 1000 Å is deposited by using a low pressure chemical vapor deposition process.
12. A photolithography process is performed to define a lateral bar having a width of 2000 Å, which is used as a support structure for a drain to be formed subsequently.
13. The silicon nitride of 1000 Å is etched by an anisotropic dry etching process.
14. The silicon oxide of 300 Å is etched by an anisotropic dry etching process, as shown in FIG. 2A.
15. The silicon is etched by 4000 Å through an anisotropic dry etching process.
16. A photoresist is removed, as shown in FIG. 2B.
17. A silicon nitride of 1000 Å is deposited by a low pressure chemical vapor deposition process.
18. The second silicon nitride layer of 1000 Å is etched by an anisotropic dry etching process, as shown in FIG. 2C.
19. The silicon is etched by 1000 Å through an anisotropic dry etching process, as shown in FIG. 2D.
20. A photolithography is preformed to protect a middle region of the silicon bar of 3000 Å, which is a region of the vertical silicon nanowire field effect transistor to be formed subsequently, as shown in FIG. 2E.
21. The silicon is etched by 1000 Å through an isotropic dry etching process to suspend the silicon bar unprotected by a photoresist.
22. The photoresist is removed, as shown in FIG. 2F.
23. The silicon is etched by 1000 Å with an HNA solution to further reduce a size of a vertical silicon pillar, as shown in FIG. 3A.
24. A silicon oxide of 800 Å is formed by a dry oxygen oxidation to further reduce the size of the vertical pillar, so that the vertical pillar becomes the vertical silicon nanowire having the diameter of about 10 nm.
25. The silicon oxynitride formed by oxidation of the second silicon nitride layer during the dry oxygen oxidation is removed by performing an etching process using a HF solution rinsing for 40s.
26. The silicon nitride of 1000 Å is removed by performing an etching process using a hot concentrated phosphoric acid solution.
27. The silicon oxide formed by the dry oxygen oxidation and the previously-deposited silicon oxide of 300Å at step 10 shown in FIG. 2A are removed by performing an etching process using a BHF solution to over-rinsing for 5s, as shown in FIG. 3B.
28. An ion implantation, in which an implantation energy is 50 keV, a dose is 4e15 cm$^{-2}$, and an implantation angle is perpendicular to a surface of a silicon wafer, is performed to implant As into a source and the drain, and an annealing is performed for 5 s at RTP 1050 degree, as shown in FIG. 4A.
29. A silicon oxide of 1 µm is deposited by a low pressure chemical vapor deposition process, and a planarization of the silicon oxide is performed by a chemical mechanical polishing (CMP) process.
30. A photolithography process is performed to protect a field oxygen region, as shown in FIG. 4B.
31. The silicon oxide is etched to a certain thickness by using a BHF solution, and the silicon oxide of 2000 Å is remained as an isolation layer of a gate and the source, as shown in FIG. 4C.
32. A photoresist is removed, as shown in FIG. 4D.
33. A gate oxide layer of 50 Å is formed by a dry oxygen oxidation.
34. A polysilicon of 8000 Å is deposited by a low pressure chemical vapor deposition, and a planarization of the polysilicon is performed by a chemical mechanical polishing (CMP) process.
35. An ion implantation, in which an implantation energy is 50 keV, a dose is 5 e$^{15}$cm$^{-2}$, and an implantation angle is perpendicular to the surface of the silicon wafer, is performed to implant As into the polysilicon, and an annealing is performed for 5 s at RTP 1050 degree.

36. A photolithography process is performed to define a gate region structure.

37. The polysilicon is etched by 6000 Å through an anisotropic dry etching process until the silicon oxide is etched.

38. A photoresist is removed.

39. The polysilicon is etched to a certain thickness by using an HNA solution, and the polysilicon with a thickness of 900 Å is remained as a gate and a lead-out for the gate, as shown in FIG. 4E.

40. A silicon oxide of 7000 Å is deposited by using a low pressure chemical vapor deposition process, and a planarization of the polysilicon is performed by a chemical mechanical polishing (CMP) process.

41. A photolithography process is performed to protect the field oxygen region, as shown in FIG. 4F.

42. The silicon oxide is etched to a certain thickness by using a BHF solution, and the silicon oxide of 2000 Å is remained as an isolation layer of the gate material and the drain, as shown in FIG. 4G.

43. A photoresist is removed, as shown in FIG. 4H.

44. A photolithography process is performed to form a contact hole for the source and the gate.

45. The silicon oxide is etched by 5000 Å through an anisotropic dry etching process.

46. The silicon oxide is etched by 500 Å by using a BHF solution.

47. A photoresist is removed, as shown in FIG. 5A.

48. A metal Ti/Al with a thicknesses of 700 Å/1 μm is sputtered.

49. A photolithography process is performed to form a lead-out for a metal interconnection.

50. The metal Al/Ti with the thickness of 1 μm/700 Å is etched by using an anisotropic dry etching process.

51. A photoresist is removed.

52. An alloying process at 430 degree is performed for 30 min, as shown in FIG. 5B.

The embodiment described above is not used to limit the present invention, those skilled in the art of the field can make various changes and modifications without departing from the spirit and the scope of the present invention, and the scope of the present invention is defined by the scope of the appended claims.

What is claimed is:

1. A fabrication method of a vertical silicon nanowire field effect transistor, comprising:
   a) defining an active region over a silicon substrate and forming a local oxidation of silicon (LOCOS) isolation;
   b) forming a vertical silicon pillar having a large diameter and a top support structure by performing a photolithography process twice and a dry etching process, so as to fabricate a vertical silicon nanowire, comprising:
      i. depositing a first silicon oxide layer and a first silicon nitride layer as a hard mask, by performing a low pressure chemical vapor deposition process;
      ii. defining a lateral bar as a support structure for a drain to be formed subsequently, by performing a photolithography process;
      iii. etching the first silicon nitride layer, the first silicon oxide layer and the silicon substrate by using an anisotropic dry etching process;
      iv. depositing a second silicon nitride layer as a sidewall structure by using a low pressure chemical vapor deposition process;
      v. etching the second silicon nitride layer by using an anisotropic dry etching process;
      vi. etching the silicon substrate to form a silicon bar by using an anisotropic dry etching process;
      vii. performing a photolithography process to protect a middle region of the silicon bar, which is a device region of the vertical silicon nanowire to be formed subsequently;
      viii. etching the silicon substrate by using an isotropic dry etching process to suspend the silicon bar which is not protected by a photoresist;
      ix. removing the photoresist;
   c) further reducing a size of the silicon pillar to form the vertical silicon nanowire having a diameter of about 10 nm, while remaining a large area of pattern used for the drain on top of the vertical silicon nanowire, so as to reduce a parasitic resistance of the drain, comprising:
      i. performing an isotropic wet etching on the silicon pillar to further reduce the size of the vertical silicon pillar;
      ii. forming a second silicon oxide layer by dry oxygen oxidation to further reduce the size of the vertical silicon pillar, so that the vertical silicon pillar becomes the vertical silicon nanowire having the diameter of about 10 nm;
      iii. removing a silicon oxynitride formed by oxidation of the second silicon nitride layer during the dry oxygen oxidation by performing a wet etching;
      iv. removing the first silicon nitride layer and the second silicon nitride layer formed through the low pressure chemical vapor deposition process by performing a wet etching process;
      v. removing the second silicon oxide layer formed through the dry oxygen oxidation and the first silicon oxide layer formed through the low pressure chemical vapor deposition, by performing a wet etching process;
   d) defining and doping a source/drain region and a channel region of the vertical silicon nanowire, comprising:
      i. performing an ion implantation for the source/drain region with an implantation angle perpendicular to a surface of the silicon substrate, and performing an annealing process;
      ii. depositing a third silicon oxide layer by using a low pressure chemical vapor deposition process, and performing a planarization of the silicon oxide by using a chemical mechanical polishing (CMP) process;
      iii. performing a photolithography process to protect a field oxygen region;
      iv. etching the third silicon oxide layer to a certain thickness by performing a wet etching, as an isolation layer of the gate material and the source;
      v. removing a photoresist;
      vi. forming a gate oxide layer by a dry oxygen oxidation;
      vii. depositing a polysilicon layer by a low pressure chemical vapor deposition, and performing a planarization of the polysilicon by using a chemical mechanical polishing (CMP) process;
      viii. performing an ion implantation process on the polysilicon layer and performing an annealing process;
      ix. performing a photolithography to define a gate region, and then etching the polysilicon layer using an anisotropic dry etching process, and removing a photoresist;
      x. etching the polysilicon to a certain thickness by using an isotropic wet etching to form a gate and a gate lead-out;

xi. depositing a fourth silicon oxide layer by using a low pressure chemical vapor deposition, and performing a planarization of the silicon oxide by using a chemical mechanical polishing (CMP) process;

xii. performing a photolithography to protect the field oxygen region;

xiii. etching the fourth silicon oxide layer by using a wet etching process until the vertical silicon nanowire is exposed, to form an isolation layer of the gate and the drain;

xiv. removing a photoresist;

e) forming a contact hole and a metal interconnection.

2. A fabrication method of an accumulative vertical silicon nanowire field effect transistor, comprising:

a) defining an active region over a silicon substrate, and forming a local oxidation of silicon (LOCOS) isolation;

b) performing a photolithography process twice and a dry etching process to form a vertical silicon pillar having a large diameter and a top support structure, so as to fabricate a vertical silicon nanowire, comprising:

i. performing an ion implantation process on the substrate to implement doping of a source/drain and a channel;

ii. depositing a first silicon oxide layer and a first silicon nitride layer as a hard mask, by using a low pressure chemical vapor deposition process;

iii. performing a photolithography process to define a lateral bar as a support structure for a drain to be formed subsequently;

iv. etching the first silicon nitride layer, the first silicon oxide layer, and the silicon substrate by using an anisotropic dry etching process;

v. depositing a second silicon nitride layer as a sidewall structure by using a low pressure chemical vapor deposition process;

vi. etching the second silicon nitride layer by using an anisotropic dry etching process;

vii. etching the silicon substrate by using an anisotropic dry etching process to form a silicon bar;

viii. performing a photolithography process to protect a middle region of the silicon bar, which is to be formed as a device region of the vertical silicon nanowire to be formed subsequently;

ix. etching the silicon substrate by using an isotropic dry etching to suspend the silicon bar which is not protected by a photoresist;

x. removing the photoresist;

c) further reducing a size of the silicon pillar to form a vertical silicon nanowire having a diameter of about 10 nm, while remaining a large area of pattern used for the drain on top of the vertical silicon nanowire, so as to reduce a parasitic resistance of the drain, comprising:

i. etching the silicon by using an isotropic wet etching process to further reduce the size of the silicon pillar;

ii. forming a second silicon oxide layer by dry oxygen oxidation to further reduce the size of the vertical silicon pillar, so that the vertical silicon pillar becomes the vertical silicon nanowire having the diameter of about 10 nm;

iii. removing a silicon oxynitride formed by oxidation of the second silicon nitride layer during the dry oxygen oxidation by performing a wet etching;

iv. removing the first silicon nitride layer and the second silicon nitride layer formed through the low pressure chemical vapor deposition process by performing a wet etching process;

v. removing the second silicon oxide layer formed through the dry oxygen oxidation and the first silicon oxide layer formed through the low pressure chemical vapor deposition, by performing a wet etching;

d) defining and doping a source/drain region and a channel region of the vertical silicon nanowire, comprising:

i. depositing a third silicon oxide layer by using a low pressure chemical vapor deposition process, and performing a planarization of the silicon oxide by using a chemical mechanical polishing (CMP) process;

ii. performing a photolithography process to protect a field oxygen region;

iii. etching the third silicon oxide layer to a certain thickness by performing a wet etching, as an isolation layer of the gate and the source;

iv. removing a photoresist;

v. forming a gate oxide layer by a dry oxygen oxidation;

vi. depositing a polysilicon layer by a low pressure chemical vapor deposition, and performing a planarization of the polysilicon layer by using a chemical mechanical polishing (CMP) process;

vii. performing an ion implantation on the polysilicon and performing an annealing process;

viii. performing a photolithography process to define a gate region, and then etching the polysilicon using an anisotropic dry etching process, and removing a photoresist;

ix. etching the polysilicon to a certain thickness by using an isotropic wet etching to form a gate and a gate lead-out;

x. depositing a fourth silicon oxide layer by using a low pressure chemical vapor deposition, and performing a planarization of the silicon oxide by using a chemical mechanical polishing process;

xi. performing a photolithography to protect the field oxygen region;

xii. etching the fourth silicon oxide layer by using a wet etching process until the vertical silicon nanowire is exposed to form an isolation layer of the gate material and the drain;

xiii. removing a photoresist;

e) forming a contact hole and a metal interconnection.

3. The fabrication method according to claim 1, wherein, the step a) of forming the LOCOS isolation comprises:

i. depositing a first silicon oxide layer, a silicon nitride layer over a silicon substrate as a hard mask, by performing a low pressure chemical vapor deposition;

ii. defining the pattern of the active region by performing a photolithography process;

iii. etching the silicon nitride layer by an anisotropic dry etching process and etching the first silicon oxide layer by an etching process through a buffered hydrofluoric acid (BHF) solution, so as to transfer the pattern onto the hard mask;

iv. removing a photoresist;

v. forming a second silicon oxide layer over the field oxygen region by performing an oxyhydrogen oxidation to form the LOCOS isolation;

vi. removing the silicon nitride layer by performing an etching using a hot concentrated phosphoric acid solution;

vii. removing the first silicon oxide layer by performing an etching using a buffered hydrofluoric acid (BHF) solution.

4. The fabrication method according to claim 1, wherein, the depositions of the first, third and fourth silicon oxide layers and the first and second silicon nitride layers use a low pressure chemical vapor deposition method.

5. The fabrication method according to claim 1, wherein, in the step b), a width of the silicon bar and a length of a photoresist-protecting silicon bar are designed to have a ratio of 1:2.

6. The fabrication method according to claim 1, wherein, in the steps b) and c), the silicon substrate and the polysilicon are etched by an isotropic wet etching process using an HNA ($HF/HNO_3/CH_3COOH$) solution.

7. The fabrication method according to claim 1, wherein, in the step c), the first and second silicon nitride layers are etched by a wet etching process using a hot concentrated phosphoric acid solution, the silicon oxynitride is etched by a wet etching process using an HF solution.

8. The fabrication method according to claim 1, wherein, the step e) comprises:
  i. performing a photolithography process to form contact holes for the source and the gate;
  ii. etching the fourth silicon oxide layer by using an anisotropic dry etching process;
  iii. etching the third silicon oxide layer by using a buffered hydrofluoric acid (BHF) solution;
  iv. removing a first photoresist;
  v. sputtering a metal layer;
  vi. performing a photolithography process to form a lead out for a metal interconnection;
  vii. etching the metal layer by using an anisotropic dry etching process;
  viii. removing a second photoresist;
  ix. performing an alloying process.

9. The fabrication method according to claim 1, wherein, in the steps c), d) and e), the first, second, third and fourth silicon oxide layers are etched by a wet etching using a buffered hydrofluoric acid (BHF) solution.

* * * * *